United States Patent
Willer et al.

(10) Patent No.: US 6,518,613 B2
(45) Date of Patent: Feb. 11, 2003

(54) MEMORY CELL CONFIGURATION WITH CAPACITOR ON OPPOSITE SURFACE OF SUBSTRATE AND METHOD FOR FABRICATING THE SAME

(75) Inventors: Josef Willer, Riemerling (DE); Hans Reisinger, Grünwald (DE); Till Schlosser, Dresden (DE); Reinhard Stengl, Stadtbergen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/968,304

(22) Filed: Oct. 1, 2001

(65) Prior Publication Data
US 2002/0071320 A1 Jun. 13, 2002

Related U.S. Application Data

(63) Continuation of application No. PCT/DE00/00906, filed on Mar. 24, 2000.

(30) Foreign Application Priority Data

Mar. 30, 1999 (DE) .......................................... 199 14 496

(51) Int. Cl.[7] ............................................. H01L 27/108
(52) U.S. Cl. ........................ 257/296; 257/329; 257/334; 438/238
(58) Field of Search .................................. 257/296, 329, 257/334; 438/238

(56) References Cited

U.S. PATENT DOCUMENTS

| | | | | |
|---|---|---|---|---|
| 4,939,568 A | * | 7/1990 | Kato et al. | 357/75 |
| 4,959,709 A | * | 9/1990 | Watanabe | 357/23.6 |
| 5,504,359 A | * | 4/1996 | Rodder | 257/329 |
| 5,554,870 A | * | 9/1996 | Fitch et al. | 257/334 |
| 6,043,527 A | * | 3/2000 | Forbes | 257/296 |

FOREIGN PATENT DOCUMENTS

| | | |
|---|---|---|
| DE | 38 40 559 A1 | 6/1989 |
| EP | 0 682 372 A1 | 11/1995 |
| JP | 01 253 956 | 10/1989 |
| JP | 06 045 550 | 2/1994 |
| JP | 07 122 653 | 5/1995 |

* cited by examiner

Primary Examiner—David Nelms
Assistant Examiner—Tu-Tu Ho
(74) Attorney, Agent, or Firm—Laurence A. Greenberg; Werner H. Stemer; Ralph E. Locher

(57) ABSTRACT

A MOS transistor of a memory cell and a bit line connected thereto are disposed on a first surface of a substrate. A capacitor of the memory cell is disposed on a second surface of the substrate, the second surface being opposite to the first surface. A contact is disposed in the substrate and connects the capacitor to the MOS transistor.

6 Claims, 6 Drawing Sheets

MEMORY CELL CONFIGURATION WITH CAPACITOR ON OPPOSITE SURFACE OF SUBSTRATE AND METHOD FOR FABRICATING THE SAME

CROSS-REFERENCE TO RELATED APPLICATION

This application is a continuation of copending International Application No. PCT/DE00/00906, filed Mar. 24, 2000, which designated the United States.

BACKGROUND OF THE INVENTION

FIELD OF THE INVENTION

The invention relates to a memory cell configuration and a method for fabricating it.

Such a method is disclosed for example in the reference by S. Nakamura, "Giga-bit DRAM Cells With Low Capacitance and Low Resistance Bit-Lines on Buried MOSFETs and Capacitors by Using Bonded SOI Technology—Reversed-Stacked-Capacitor (RSTC) Cell—" IEDM 95, 889. The memory cell configuration produced by the method is a DRAM cell configuration, in other words a dynamic random access memory cell configuration. A memory cell of the memory cell configuration contains a transistor and a capacitor on which the information of the memory cell is stored in the form of a charge. The capacitor is connected to the transistor in such a way that when the transistor is driven via a word line, the charge of the capacitor can be read out via a bit line. The planar transistor and, above it, the capacitor are produced on a first surface of a substrate. Borophosphorus silicate glass (BPSG) is deposited over the capacitor and polished to produce a planar area. On this area, the substrate is connected to a support substrate. Afterward, a second surface of the substrate, the surface being opposite to the first surface, is removed until an insulating structure that surrounds the transistor is uncovered. After a thermal oxidation, an insulating material is deposited. In the insulating material, a contact hole to a source/drain region of the transistor is produced. A bit line is produced on the insulating material. Part of the bit line is disposed in the contact hole and adjoins the source/drain region.

SUMMARY OF THE INVENTION

It is accordingly an object of the invention to provide a memory cell configuration and a method for fabricating it that overcome the above-mentioned disadvantages of the prior art devices and methods of this general type, which can be fabricated with an increased process reliability compared with the prior art.

With the foregoing and other objects in view there is provided, in accordance with the invention, a memory cell configuration. The memory cell contains a substrate having a first surface and a second surface disposed opposite to the first surface, a bit line, and a metal oxide semiconductor transistor connected to the bit line and disposed on the first surface. A capacitor is disposed on the second surface of the substrate, and a contact is disposed in the substrate and connects the capacitor to the MOS transistor.

The problem is solved by the memory cell configuration in which the metal oxide semiconductor (MOS) transistor of the memory cell and the bit line connected thereto are disposed on the first surface of the substrate. The capacitor of the memory cell is disposed on the second surface of the substrate, the surface being opposite to the first surface. A contact disposed in the substrate connects the capacitor to the MOS transistor.

The problem is furthermore solved by a method for fabricating a memory cell configuration in which a MOS transistor of a memory cell and a bit line connected thereto are produced on a first surface of a substrate. A second surface of the substrate, the surface being opposite to the first surface, is removed. A capacitor of the memory cell is produced on the second surface. A contact that connects the capacitor to the MOS transistor is produced in the substrate.

The influence of the method for producing the capacitor on the MOS transistor is slight because the MOS transistor is disposed on a different side of the substrate than the capacitor. The invention consequently enables many degrees of freedom for the production of the capacitors, for example with regard to the choice of materials and also the choice of process steps. The process reliability is increased compared with the prior art.

In order to increase the packing density of the memory cell configuration, it is advantageous to produce the contact in the first surface in such a way that it reaches more deeply into the substrate than the MOS transistor and the bit line, subsequently to remove the second surface of the substrate until the contact is uncovered, and finally, on the second surface, to produce the capacitor on the contact.

As a result of the contact being uncovered, its position is identified, so that the capacitor can be exactly aligned with respect to the MOS transistor. The memory cell configuration can consequently be produced with a high packing density.

In order to increase a capacitance of the capacitor, a surface of a capacitor electrode on which a capacitor dielectric is disposed, is as large as possible. To ensure that a packing density of the DRAM cell configuration is as large as possible, a space requirement of the capacitor is as small as possible. Both advantages can be obtained if the surface of the capacitor electrode has protuberances and/or indentations.

In order to increase the capacitance of the capacitor, the capacitor dielectric preferably has a dielectric constant of more than 20. By way of example, the capacitor dielectric is composed of a ferroelectric, such as e.g. barium strontium titanate or of $Ta_2O_5$.

The contact connects a first source/drain region of the MOS transistor to the capacitor electrode of the capacitor. A second source/drain region of the MOS transistor is connected to the bit line. A gate electrode of the MOS transistor is connected to a word line that runs transversely with respect to the bit line. The bit line may, for example, run above the first surface of the substrate.

The MOS transistor may be configured as a planar transistor.

In order to increase the packing density of the memory cell configuration, the MOS transistor is preferably produced as a vertical transistor. The first source/drain region is disposed below the second source/drain region, for example. The first source/drain region can laterally adjoin the contact.

It lies within the scope of the invention to produce the first source/drain region above the second source/drain region.

A contact hole is preferably produced in the first surface. In order to produce the contact, a conductive material is deposited and etched back in such a way that the contact hole is not completely filled. The depth of an upper surface of the contact is dimensioned in such a way that the contact adjoins the first source/drain region, which may be part of the substrate and is disposed below the second source/drain region. Before the production of the contact, the contact hole is provided with an insulation, with the result that the contact is insulated from the rest of the substrate. In the contact hole, a gate electrode of the MOS transistor is produced above the contact, the gate electrode being insulated from the contact and substrate. The second source/drain region is likewise produced as part of the substrate and laterally adjoins the contact hole.

As an alternative, the gate electrode is produced in a substrate depression that is different from the contact hole.

The contact preferably protrudes from the second surface of the substrate. In this case, a short circuit between the substrate and the contact when producing the capacitor electrode can be avoided particularly easily by insulating material being deposited and removed until the contact is uncovered. The substrate is then covered with the insulating material, and the capacitor electrode can be produced on the insulating material and on the contact, without it adjoining the substrate.

One possibility for being able to achieve the result that the capacitor protrudes from the second surface of the substrate is described below. After the substrate is removed until the contact is uncovered, the contact is etched selectively with respect to the substrate, a depression thereby being produced. The depression is filled with an auxiliary structure, with the result that the auxiliary structure covers the contact. For this purpose, material is deposited and removed until the substrate is uncovered. Afterward, the substrate is etched selectively with respect to the auxiliary structure, with the result that the auxiliary structure and also part of the contact protrude. The insulating material can then be deposited and removed together with the auxiliary structure until the auxiliary structure is removed and, consequently, the contact is uncovered. The insulating material and a surface of the contact form a planar area. At the same time, the contact protrudes beyond the second surface of the substrate.

The substrate may be composed of silicon. The contact may be composed of doped polysilicon. An example of a suitable etchant for selectively etching the contact is a solution containing HF, $HNO_3$ and $CH_3COOH$.

Other features which are considered as characteristic for the invention are set forth in the appended claims.

Although the invention is illustrated and described herein as embodied in a memory cell configuration and a method for fabricating it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
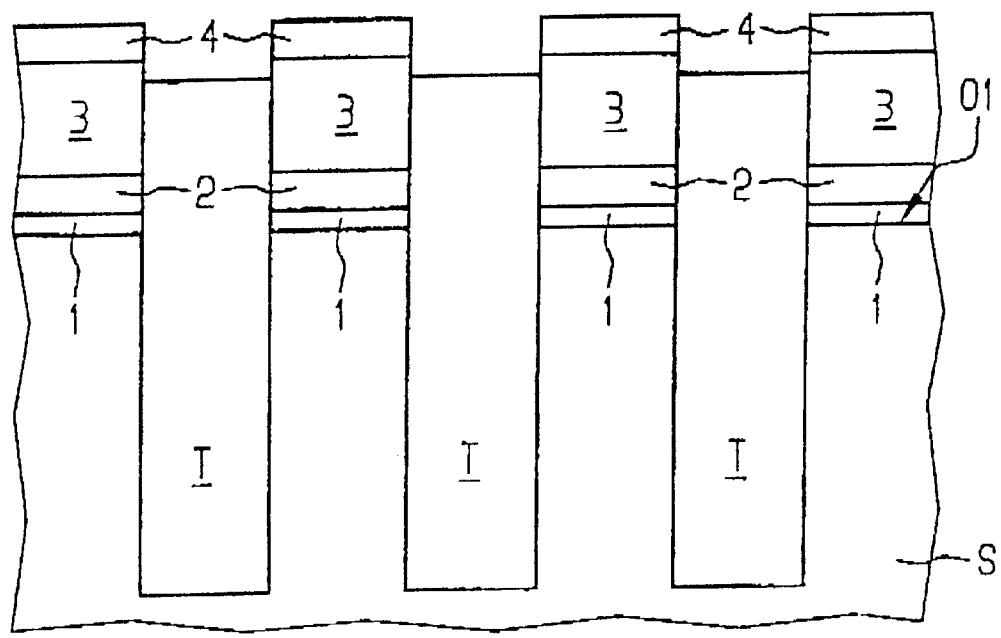
FIG. 1 is a diagrammatic, cross-sectional view through a substrate after the production of a first layer, a second layer, a third layer, a fourth layer and isolating structures according to the invention.

The figures of the drawing are diagrammatic and are not to scale.

DESCRIPTION OF THE PREFERRED EMBODIMENTS

In all the figures of the drawing, sub-features and integral parts that correspond to one another bear the same reference symbol in each case. Referring now to the figures of the drawing in detail and first, particularly, to FIG. 1 thereof, there is shown an exemplary embodiment of the invention. A p-doped substrate S made of silicon is provided as a starting material. The substrate S is p-doped with a dopant concentration of approximately $10^{18}$ cm$^{-3}$ in a layer adjoining a first surface O1 of the substrate S. A first layer 1 made of $SiO_2$ and having a thickness of approximately 20 nm is produced on the first surface O1 by thermal oxidation. Above the first layer 1 the following are deposited: a second layer 2 made of silicon nitride and having a thickness of approximately 100 nm, above the latter, by a chemical vapor deposition (CVD) method, a third layer 3 made of $SiO_2$ and having a thickness of approximately 800 nm, and, above the latter, a fourth layer 4 made of silicon nitride and having a thickness of approximately 100 nm.

With the aid of a non-illustrated first strip-type photoresist mask, the fourth layer 4, the third layer 3, the second layer 2, the first layer 1 and the substrate S are etched anisotropically, thereby producing in the substrate S first trenches which have a depth of approximately 300 nm, a width of approximately 100 nm and spacings of approximately 100 nm from one another. Suitable etchants are e.g. $CF_4$, $CHF_3$, $C_2F_6$ and HBr, which are combined in accordance with the material to be etched.

Isolating structures T are produced in the first trenches by $SiO_2$ being conformally deposited to a thickness of approximately 200 nm and being planarized by chemical mechanical polishing until an upper area of the fourth layer 4 is uncovered. Afterward, the $SiO_2$ is etched back selectively with respect to silicon nitride until an upper area of the isolating structures T lies below an upper area of the third layer 3 (see FIG. 1).

Figure 2:
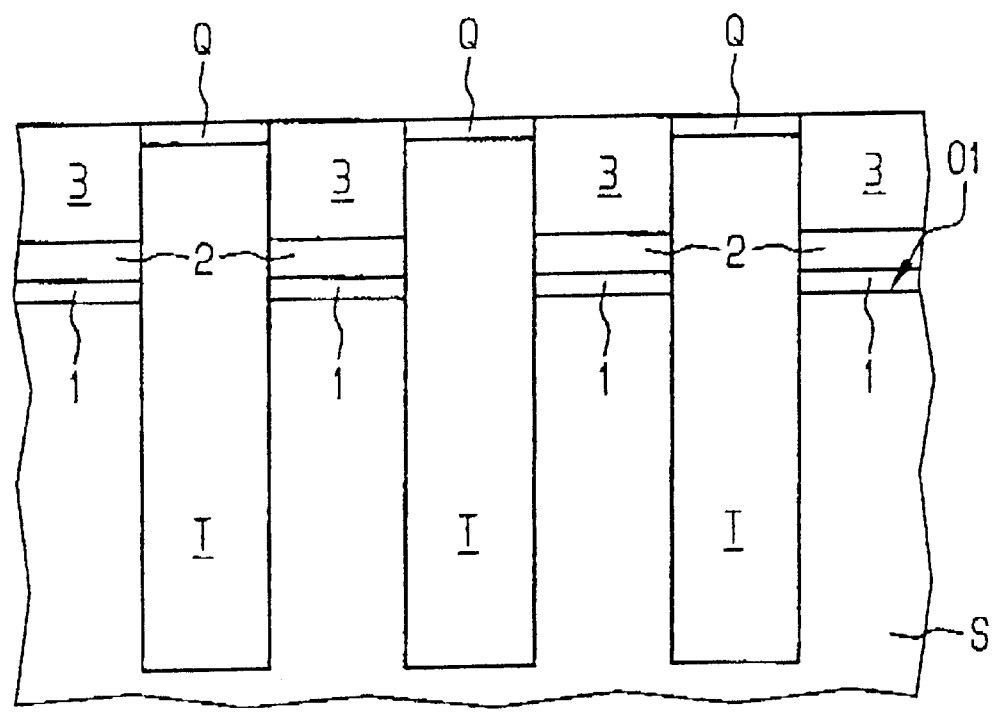
FIG. 2 is a cross-sectional after the fourth layer has been removed and first auxiliary structures have been produced.

Afterward, silicon nitride is deposited and planarized by chemical mechanical polishing until the upper area of the third layer 3 is uncovered (FIG. 2). In this way, first auxiliary structures Q made of the silicon nitride are produced above the isolating structures T.

Figure 3:
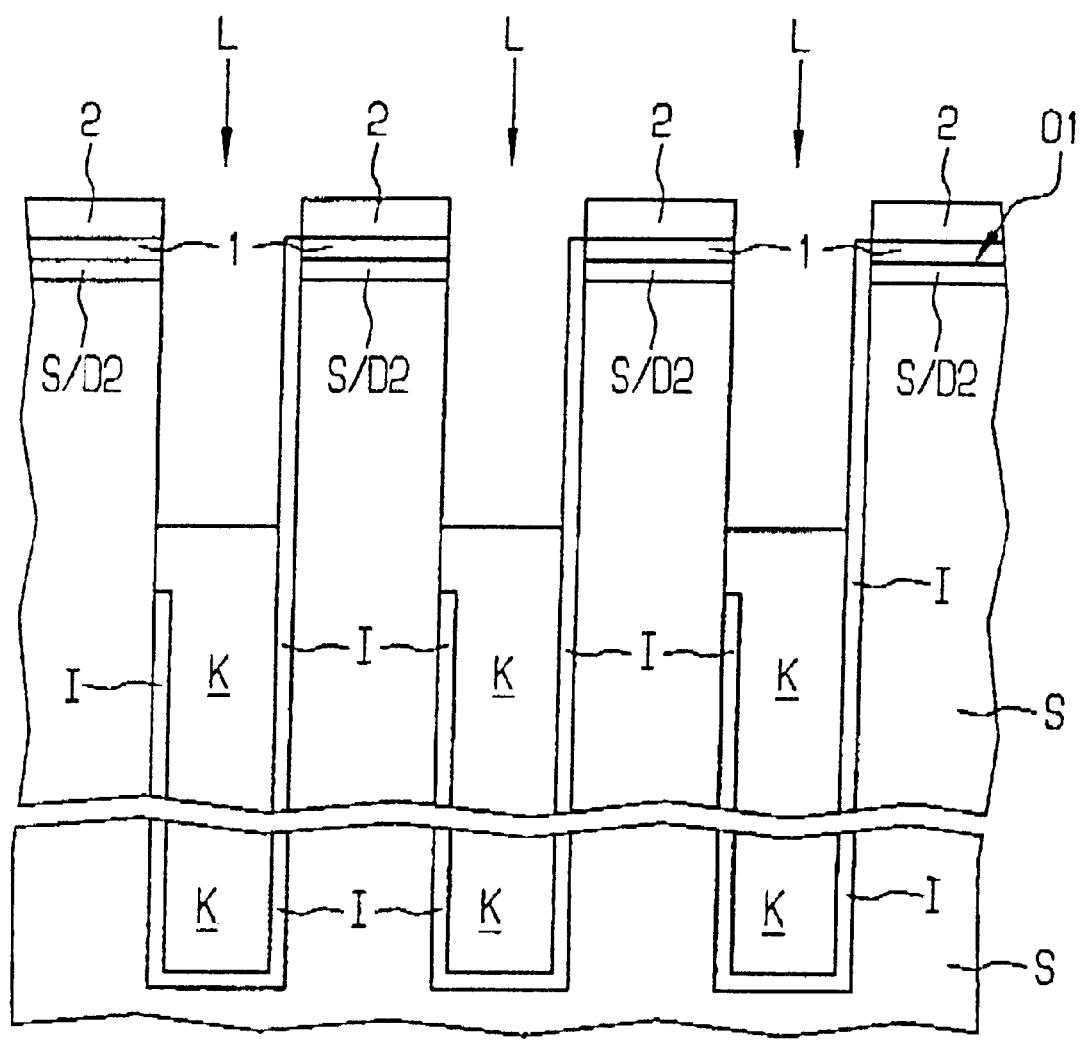
FIG. 3 is a cross-sectional view, perpendicular to the view shown in FIG. 2, through the substrate after the production of contact holes, an insulation, upper source/drain regions of transistors and contacts.

With the aid of a non-illustrated strip-type second photoresist mask, whose strips run transversely with respect to the strips of the first photoresist mask, have a width of approximately 100 nm and have spacings of approximately 100 nm from one another, the $SiO_2$ is etched selectively with respect to the silicon nitride using $C_4F_6$, CO, for example until the second layer 2 is partly uncovered (FIG. 3). Afterward, the silicon nitride is etched, with the result that the first auxiliary structures Q and uncovered parts of the second layer 2 are removed. By etching silicon selectively with respect to the $SiO_2$, on account of the finite selectivity of the etching process, the first layer 1 is partly severed and contact holes L are subsequently produced. In this case, the isolating structures T and the third layer 3 act as a thick mask. The contact holes L have a depth of approximately 5000 nm (see FIG. 3).

By a thermal oxidation process, the contact holes L are provided with an insulation I having a thickness of approximately 15 nm (see FIG. 3).

Afterward, in-situ-doped polysilicon is deposited to a thickness of approximately 50 nm and planarized by chemical mechanical polishing until the second layer 2 is uncovered. In this case, the third layer 3 is removed and the isolating structures T are removed somewhat. Afterward, the polysilicon is etched back to a depth of approximately 470 nm.

With the aid of a non-illustrated third photoresist mask, parts of the insulation I are removed from first sidewalls of the contact holes L (see FIG. 3).

Afterward, in-situ-doped polysilicon is deposited to a thickness of approximately 50 nm and planarized by chemical mechanical polishing until the second layer 2 is uncovered.

Upper source/drain regions S/D2 of vertical transistors, the regions having a thickness of approximately 30 nm, are produced below the first layer 1 by an implantation with n-doping ions in the substrate S (see FIG. 3). On account of the isolating structures T and the contact holes L, the upper source/drain regions S/D2 have square horizontal cross sections with a side length of approximately 100 nm. Mutually adjacent upper source/drain regions S/D2 are isolated from one another by the isolating structures T or by the contact holes L.

The polysilicon is subsequently etched back down to a depth of approximately 300 nm below the first surface O1, with the result that contacts K are produced in the contact holes L, the contacts K adjoining the substrate S on the first sidewalls of the contact holes L (see FIG. 3).

Afterward, the second layer 2 is removed using hot phosphoric acid, for example.

By a thermal oxidation process, a gate dielectric Gd is produced on the first sidewalls of the contact holes L. The gate dielectric Gd also covers the contacts K (see FIG. 4). The thermal oxidation acts as a heat treatment step through which dopant diffuses from the contacts K into the substrate S, where it forms lower source/drain regions S/D1 of the transistors (see FIG. 4).

Afterward, in-situ-doped polysilicon is deposited to a thickness of approximately 60 nm, thereby filling the contact holes L. Tungsten silicide is deposited above that to a thickness of approximately 50 nm. A protective layer 5 made of silicon nitride and having a thickness of approximately 100 nm is deposited above that.

With the aid of a non-illustrated strip-type fourth photoresist mask, whose strips run transversely with respect to the isolating structures T, the protective layer 5, tungsten silicide and polysilicon are etched until the gate dielectric Gd is uncovered. Word lines W are thereby formed from the tungsten silicide and the polysilicon, the word lines W being covered by the protective layer 5 (see FIG. 4). The word lines W have a width of approximately 100 nm and a spacing of approximately 100 nm from one another. The word lines W are disposed offset with respect to the contact holes L, with the result that first parts of the word lines W have a strip-type horizontal cross section and run above parts of the upper source/drain regions S/D2 covered by the first layer 1. Second parts of the word lines W are disposed in the contact holes L, on the first sidewalls thereof.

In order to produce insulating structures I1 in the contact holes L, $SiO_2$ is deposited to a thickness of approximately 50 nm and etched back until the first layer 1 is uncovered, which first layer 1 is more difficult to etch on account of its density.

Figure 4:
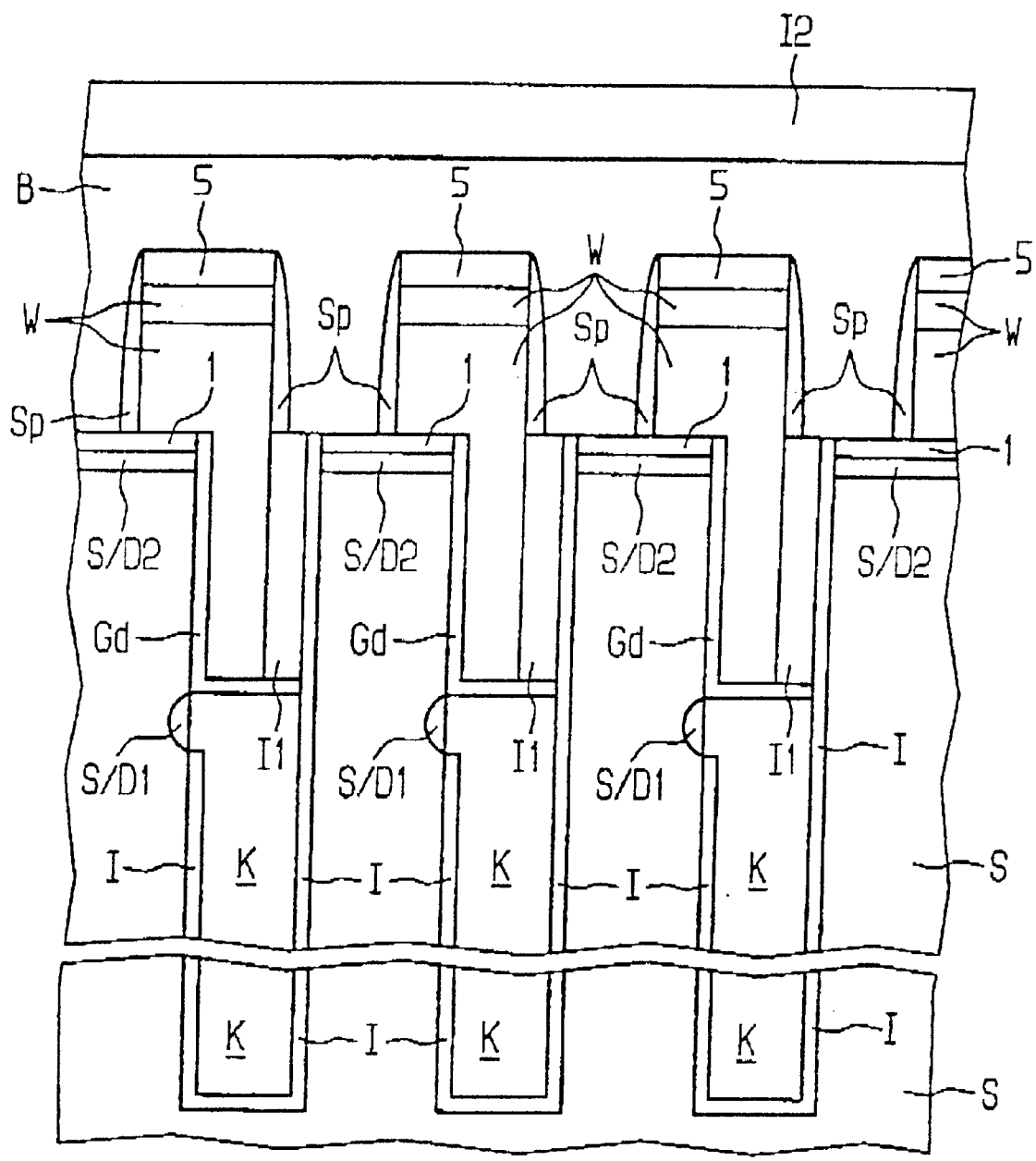
FIG. 4 is a cross-sectional view after the production of a gate dielectric, lower source/drain regions, word lines, a protective layer, spacers, a first insulating layer, bit lines and a second insulating layer.

In order to encapsulate the word lines W, spacers Sp are produced by silicon nitride being deposited to a thickness of approximately 15 nm and etched back anisotropically (see FIG. 4).

In order to produce a first insulating layer (not illustrated) having a thickness of approximately 300 nm, $SiO_2$ is deposited and planarized by chemical mechanical polishing until a planar area is produced.

With the aid of a non-illustrated strip-type fifth photoresist mask, whose strips are disposed above the isolating structures T, the $SiO_2$ is etched until the upper source/drain regions S/D2 are uncovered and second trenches are produced in the first insulating layer, which trenches are particularly deep in regions between the word lines W. Parts of the gate dielectric Gd are removed in the process. The protective layer 5 and the spacers Sp protect the word lines W in this case.

In order to produce bit lines B, first in-situ-doped polysilicon is deposited to a thickness of approximately 50 nm and etched back until there are approximately 30 nm of polysilicon lying above the protective layer 5. Afterward, titanium and titanium nitride are deposited to a thickness of approximately 20 nm and tungsten is deposited to a thickness of approximately 60 nm and planarized by chemical mechanical polishing until the first insulating layer is uncovered, with the result that bit lines B are produced from the tungsten, the titanium, the titanium nitride and the polysilicon in a self-aligned manner in the second trenches (see-FIG. 4). First parts of the bit lines B form strips running transversely with respect to the word lines W, and second parts of the bit lines B are disposed between mutually adjacent word lines W and adjoin the upper source/drain regions S/D2.

In order to produce a second insulating layer I2, $SiO_2$ is deposited and subjected to chemical mechanical polishing until the second insulating layer I2 has a planar surface (see FIG. 4).

Afterward, the substrate S is connected to a non-illustrated support substrate in such a way that the bit lines B are disposed between the substrate S and the support substrate.

A second surface O2 of the substrate S, the second surface O2 being opposite to the first surface O1, is removed by chemical mechanical polishing until the contacts K are uncovered.

Figure 5:
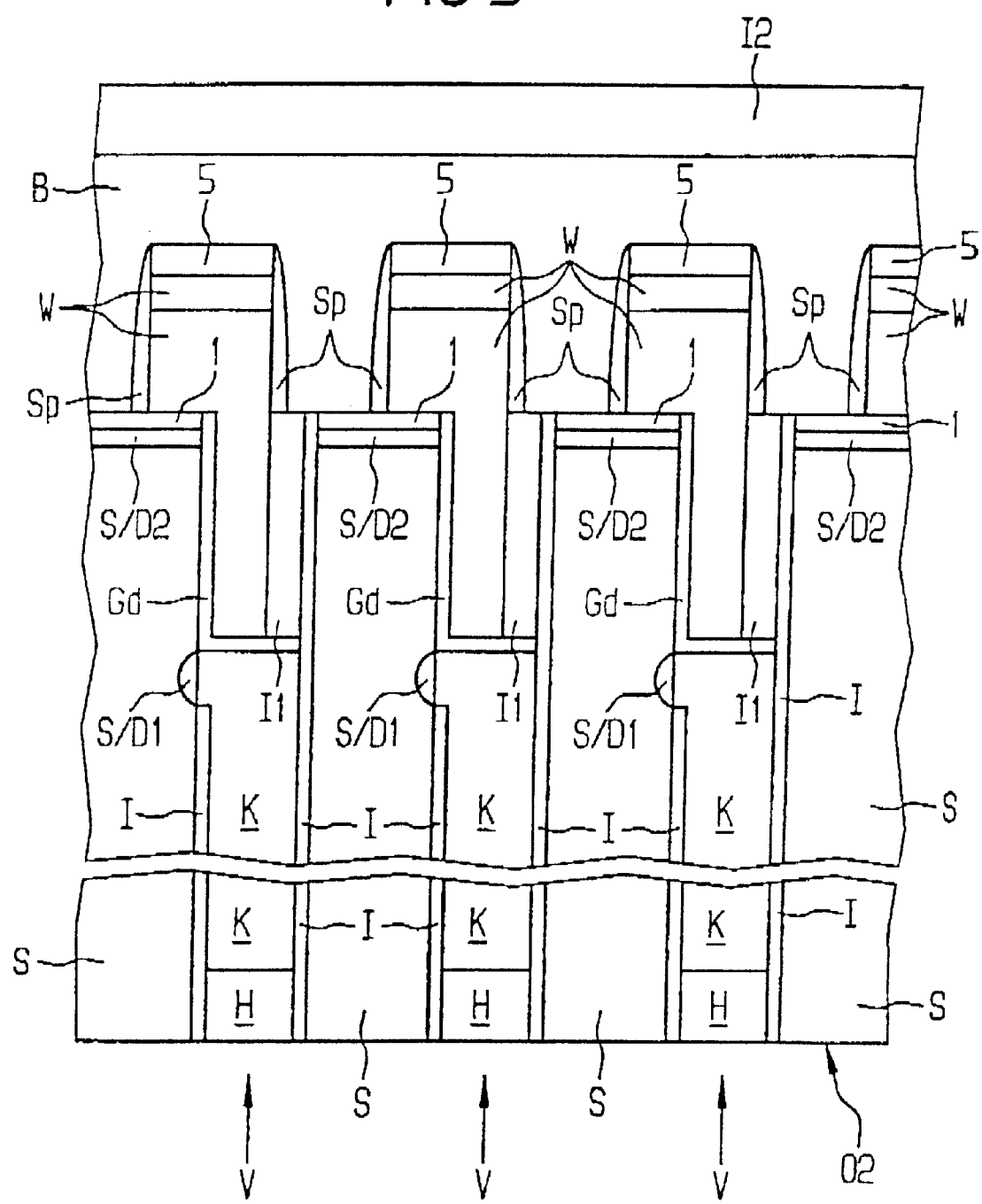
FIG. 5 is a cross-sectional view after the contacts have been uncovered and depressions and auxiliary structures have been produced.

Afterward, polysilicon is etched selectively with respect to the silicon to a depth of approximately 30 nm, depressions V thereby being produced. The depressions V are filled with further auxiliary structures H by silicon nitride being deposited to a thickness of approximately 50 nm and planarized by chemical mechanical polishing until the substrate S is uncovered (see FIG. 5).

Afterward, the substrate S is etched back selectively with respect to silicon nitride to a depth of approximately 60 nm, with the result that the auxiliary structures H and parts of the contacts K protrude.

Figure 6:
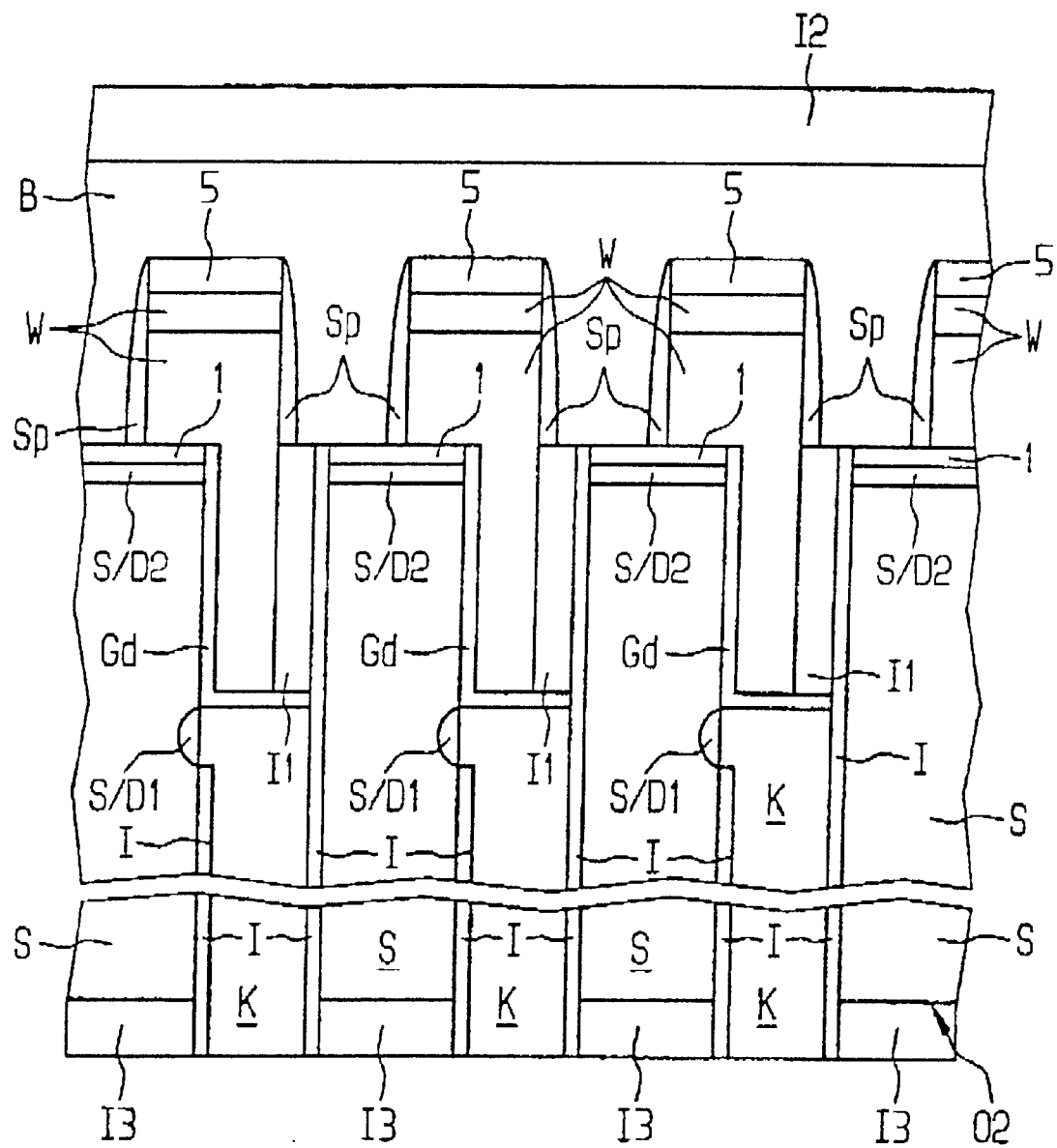
FIG. 6 is a cross-sectional view after a third insulating layer has been produced and the auxiliary structures have been removed.

In order to produce a third insulating layer I3, SiO$_2$ is deposited to a thickness of approximately 50 nm and planarized by chemical mechanical polishing until the auxiliary structures H are removed and the contacts K are uncovered (see FIG. 6).

Figure 7:
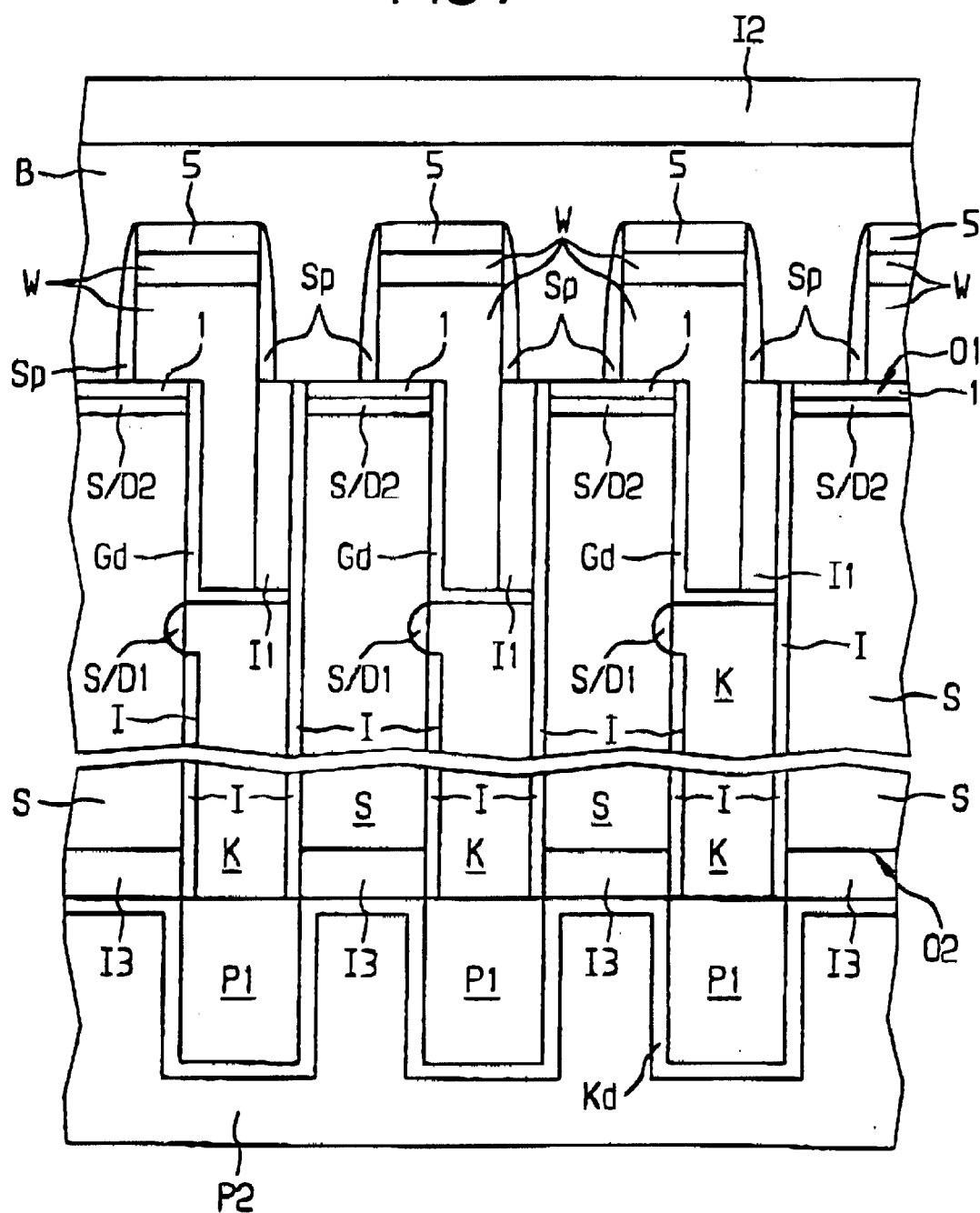
FIG. 7 is a cross-sectional view of the production of a capacitor electrode, a capacitor dielectric and a capacitor plate of capacitors.

Afterward, tungsten nitride is deposited to a thickness of approximately 1000 nm and patterned with the aid of a sixth photoresist mask in such a way that cylindrical capacitor electrodes P1 of capacitors, which adjoin the contacts K, are produced from the tungsten nitride (see FIG. 7).

In order to produce a capacitor dielectric Kd that covers the capacitor electrodes P1, Ta$_2$O$_5$ is applied to a thickness of approximately 10 nm (see FIG. 7).

Afterward, TiN is deposited to a thickness of approximately 100 nm, with the result that a capacitor plate P2 is produced above the capacitor dielectric Kd, which capacitor plate serves as a common further capacitor electrode of the capacitors (see FIG. 7).

A DRAM cell configuration is produced in the exemplary embodiment. A memory cell containing one of the vertical transistors and one of the capacitors, which is connected in series with the transistor. Parts of the word lines W that are disposed on the first sidewalls of the contact holes L act as gate electrodes of the transistors. Channel regions of the transistors are parts of the substrate S which are disposed between the upper source/drain regions S/D2 and the lower source/drain regions S/D1.

There are many conceivable variations of the exemplary embodiment that likewise lie within the scope of the invention. Thus, dimensions of the layers, depressions, trenches and structures can be adapted to the respective requirements. The same applies to the choice of materials.

Metallization planes can be produced in the second insulating layer I2.

We claim:

1. A memory cell configuration, comprising:
    a substrate having a first surface and a second surface disposed opposite to said first surface;
    a bit line;
    a metal oxide semiconductor (MOS) transistor connected to said bit line and disposed on said first surface;
    a capacitor disposed on said second surface of said substrate, said capacitor having an electrode;
    a contact disposed in said substrate and connecting said capacitor to said MOS transistor, said electrode of said capacitor disposed on said contact; and
    an insulating layer disposed on said second surface, said contact and said insulating layer forming a planarized surface.

2. A method for fabricating a memory cell configuration, which comprises the steps of:
    providing a substrate having a first surface and a second surface disposed opposite to the first surface;
    producing a contact in the substrate;
    producing a MOS transistor and a bit line connected thereto on the first surface of the substrate;
    removing a layer of material of the substrate at the second surface of the substrate resulting in a newly produced second surface;
    depositing an insulating material on the second surface of the substrate;
    planarizing the insulating material and the contact, thereby obtaining a planarized surface; and
    producing a first electrode of a capacitor on the planarized surface of the contact, and depositing a capacitor dielectric and a second electrode of the capacitor.

3. The method according to claim 2, which comprises producing the contact in the first surface in such a way that it reaches more deeply into the substrate than the MOS transistor and the bit line, and the layer of material of the substrate of the second surface of the substrate is removed until the contact is uncovered, in which, on the newly produced second surface, the capacitor is produced on the contact.

4. The method according to claim 3, which comprises:
    uncovering the contact in the second surface;
    etching selectively the contact with respect to the substrate, a depression thereby being produced;
    filling the depression with an auxiliary structure, with a result that the auxiliary structure covers the contact;
    etching selectively the substrate with respect to the auxiliary structure, with a result that the auxiliary structure and part of the contact protrude;
    depositing an insulating material on the substrate; and
    removing the insulating material together with the auxiliary structure until the auxiliary structure is removed.

5. The method according to claim 2, which comprises producing the capacitor with a capacitor dielectric formed of a material selected from the group consisting of Ta$_2$O$_5$ and a ferrodielectric.

6. The method according to claim 3, which comprises:
    producing a contact hole in the first surface; depositing a conductive material in the contact hole to produce the contact, the conductive material is etched back in such a way that the contact hole is not completely filled;
    forming, in the contact hole, a gate electrode of the MOS transistor above the contact, the gate electrode being insulated from the contact and from the substrate; and
    producing a source/drain region of the MOS transistor such that the source/drain region is buried in the substrate and adjoins the contact resulting in a vertical MOS transistor.

* * * * *